(12) United States Patent
Ma

(10) Patent No.: US 9,337,441 B2
(45) Date of Patent: May 10, 2016

(54) OLED LIGHTING PANEL AND METHODS FOR FABRICATING THEREOF

(71) Applicant: Universal Display Corporation, Ewing, NJ (US)

(72) Inventor: Ruiqing Ma, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/631,990

(22) Filed: Feb. 26, 2015

(65) Prior Publication Data

US 2015/0295202 A1 Oct. 15, 2015

Related U.S. Application Data

(60) Provisional application No. 61/979,709, filed on Apr. 15, 2014.

(51) Int. Cl.
| | |
|---|---|
| *H01L 51/52* | (2006.01) |
| *H01L 51/50* | (2006.01) |
| *H01L 51/56* | (2006.01) |
| *H01L 27/32* | (2006.01) |

(52) U.S. Cl.
CPC ............ *H01L 51/5237* (2013.01); *H01L 27/32* (2013.01); *H01L 27/3202* (2013.01); *H01L 27/3204* (2013.01); *H01L 27/3297* (2013.01); *H01L 51/5012* (2013.01); *H01L 51/56* (2013.01); *H01L 51/5206* (2013.01); *H01L 51/5221* (2013.01); *H01L 2251/5361* (2013.01)

(58) Field of Classification Search
CPC ..... H01L 51/52; H01L 51/56; H01L 51/5203; H01L 51/5243; H01L 51/5296; H01L 27/3209; H01L 27/3223
See application file for complete search history.

(56) References Cited

U.S. PATENT DOCUMENTS

| | | | |
|---|---|---|---|
| 4,769,292 | A | 9/1988 | Tang et al. |
| 5,247,190 | A | 9/1993 | Friend et al. |
| 5,703,436 | A | 12/1997 | Forrest et al. |
| 5,707,745 | A | 1/1998 | Forrest et al. |
| 5,834,893 | A | 11/1998 | Bulovic et al. |
| 5,844,363 | A | 12/1998 | Gu et al. |
| 6,013,982 | A | 1/2000 | Thompson et al. |
| 6,087,196 | A | 7/2000 | Sturm et al. |

(Continued)

FOREIGN PATENT DOCUMENTS

| | | |
|---|---|---|
| EP | 1238981 | 9/2002 |
| JP | 2010/135467 | 6/2010 |

(Continued)

OTHER PUBLICATIONS

U.S. Appl. No. 61/970,937, filed Mar. 27, 2014.

(Continued)

*Primary Examiner* — Kyoung Lee
(74) *Attorney, Agent, or Firm* — Riverside Law LLP

(57) ABSTRACT

Described herein are OLED lighting systems and devices, and methods related to fabricating such OLED lighting systems and devices. The methods can be used to produce OLED systems and devices of varying sizes without changing the underlying OLED unit design. In one embodiment, the OLED lighting system includes a cover that connects a plurality of OLED lighting units. The cover includes contacts that are accessible from outside the system, such that each OLED lighting unit connected to the cover can be controlled in series or in parallel.

20 Claims, 5 Drawing Sheets

(56) References Cited

U.S. PATENT DOCUMENTS

| | | | |
|---|---|---|---|
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,693,296 | B1 | 2/2004 | Tyan |
| 7,279,704 | B2 | 10/2007 | Walters et al. |
| 7,431,968 | B1 | 10/2008 | Shtein et al. |
| 7,968,146 | B2 | 6/2011 | Wagner et al. |
| 2003/0230980 | A1 | 12/2003 | Forrest et al. |
| 2004/0174116 | A1 | 9/2004 | Lu et al. |
| 2012/0181933 | A1 | 7/2012 | Ma et al. |
| 2012/0319553 | A1 | 12/2012 | Silvernail et al. |
| 2013/0026452 | A1 | 1/2013 | Kottas et al. |
| 2013/0119354 | A1 | 5/2013 | Ma et al. |
| 2014/0054557 | A1* | 2/2014 | Jung ................ H05K 7/06 257/40 |

FOREIGN PATENT DOCUMENTS

| | | |
|---|---|---|
| WO | 2004/111066 | 12/2004 |
| WO | 2008/044723 | 4/2008 |
| WO | 2008057394 | 5/2008 |
| WO | 2010011390 | 1/2010 |
| WO | 2010/111175 | 9/2010 |

OTHER PUBLICATIONS

U.S. Appl. No. 14/661,335, filed Mar. 18, 2015.

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 1, 4-6 (1999).

* cited by examiner

OLED LIGHTING PANEL AND METHODS FOR FABRICATING THEREOF

CROSS-REFERENCE TO RELATED APPLICATIONS

This application claims priority to U.S. patent application Ser. No. 61/979,709, filed Apr. 15, 2014, the entire contents of which are incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to an organic light emitting device (OLED) light panel design and fabrication method which enables OLED light sources to be made at any size.

BACKGROUND

Currently, large OLED lighting luminaires are composed of individual small OLED panels with a typical size around 4×4 inches. These panels are made on a large piece of glass, then packaged and separated from each other by cutting the large glass into smaller pieces with OLEDs disposed thereon. These individual OLED panels can then be sent to a luminaire manufacturer for mechanical and electrical assembly. Because each OLED panel is individually packaged, the assembly is time consuming and requires a wide bezel around the active lighting area.

OLED lighting devices have many advantages as diffuse area light sources. However, there is often a trade-off between the size of the OLED panel and the uniformity of the panel. When the panel size increases, current needs to travel further laterally through the electrode. Since the transparent electrode has limited conductance, the long current path generates resistive loss in the forms of potential drop and resistive heating. The direct result of potential drop is that the panel becomes dimmer in the region further away from the contacts. As a result, currently available OLED panels typically have sizes around 2 to 6 inches.

One way to address this issue is to use buslines to reduce the potential drop, which can increase the size of the panel. However, the use of buslines can significantly increase the cost of the panel. In addition, for each different size, the panel and/or busline needs to be re-designed along with the tooling and masks used in the fabrication process. Further, even with the application of buslines, the increase in panel size is limited.

Thus, there is a continuing need in the art for an OLED lighting device that can be made in any size without the need for redesigning the equipment used in the fabrication process each time the size of the lighting device is changed. The present invention addresses this need in the art.

SUMMARY OF THE INVENTION

According to aspects of the disclosed subject matter, an organic light emitting diode (OLED) device is provided that includes a substrate; an OLED unit disposed on said substrate, said unit comprising an anode, a cathode, and at least one organic light emitting layer between the anode and cathode; two or more electrode contacts; and a cover having an inner surface and an outer surface, wherein the inner surface faces the OLED unit; and wherein at least one electrode contact is connected to the OLED unit anode and at least one electrode contact is connected to the OLED unit cathode, and each electrode contact is further connected to the cover, such that at least one electrode contact connected to the OLED unit anode and at least one electrode contact connected to the OLED unit cathode are electrically accessible from the outer surface of the cover. In one embodiment, the OLED unit is hermetically sealed. In one embodiment, the OLED unit comprises at least two pixels. In one embodiment, each pixel comprises a fuse. In one embodiment, each pixel is hermetically sealed. In one embodiment, the device is flexible. In one embodiment, the cover is substantially impermeable to moisture and air. In one embodiment, the substrate comprises glass. In one embodiment, the cover further includes a circuit for coupling at least two electrode contacts together. In one embodiment, the cover is suitable for connecting to a plurality of OLED units. In one embodiment, the cover further includes a circuit for connecting the plurality of OLED units in series. In one embodiment, the cover further includes a circuit for connecting the plurality of OLED units in parallel. In one embodiment, the OLED unit further includes a thin film encapsulation layer between the cover and the cathode. In one embodiment, at least a portion of the OLED unit anode is encapsulated in an insulating bank. In one embodiment, at least one electrode contact includes a conductive ink. In one embodiment, at least one electrode contact includes a z-direction conductive glue. In one embodiment, the cover is disposed over only a portion of the OLED unit. In one embodiment, the device further includes at least one additional electrode. In one embodiment, the device further includes one or more additional OLED units, wherein the cover is disposed over at least a portion of each OLED unit. In one embodiment, each OLED unit is electrically isolated before the cover is applied.

According to aspects of the disclosed subject matter, a method of fabricating an OLED device is described including providing a substrate, disposing an OLED unit on the substrate, said unit comprising an anode, a cathode, and at least one organic light emitting layer between the anode and cathode, providing a cover having an inner surface, an outer surface, one or more anode cover contacts, and one or more cathode cover contacts, and connecting together the cover and the OLED unit, wherein the inner surface of the cover faces the OLED unit, and at least one of the one or more anode cover contacts and at least one of the one or more cathode cover contacts are electrically accessible from the outer surface of the cover. In one embodiment, the method further includes disposing at least one additional OLED unit on the substrate prior to connecting the cover and the OLED units together. In one embodiment, the method further includes the step of dividing the OLED units into panels of one or more OLED units. In one embodiment, the step of dividing the OLED units into panels is performed prior to connecting the cover to the OLED units. In one embodiment, each OLED unit is electrically isolated before the cover is applied. In one embodiment, the method further includes at least one additional OLED unit on at least one additional substrate and connected the at least one additional OLED unit to the cover. In one embodiment, the OLED unit is hermetically sealed. In one embodiment, the OLED unit comprises at least two pixels. In one embodiment, each pixel comprises a fuse. In one embodiment, each pixel is hermetically sealed. In one embodiment, the device is flexible. In one embodiment, the cover is substantially impermeable to moisture and air. In one embodiment, the substrate comprises glass. In one embodiment, the cover further comprises a circuit for communicatively coupling the one or more anode contacts. In one embodiment, the cover further comprises a circuit for communicatively coupling the one or more cathode contacts. In one embodiment, the cover further comprises a circuit for connecting the OLED units in series. In one embodiment, the cover further comprises a circuit for connecting the plurality of OLED units in parallel. In one embodiment, the method further comprises the step of applying a thin film encapsulation layer between the cathode and the cover. In one embodiment, the method further comprises the step of encapsulating at least a portion of the OLED unit anode in an insulating bank. In one embodiment, the cover is connected to the OLED unit via glue. In one embodiment, the OLED unit further comprises one or more anode contact points connected to the anode, and one or more cathode contact points connected to the cathode, and wherein the cover is connected to the OLED unit, at least one of the one or more anode cover contacts is in contact with an anode contact point on the OLED unit and at least one of the one or more cathode cover contacts is in contact with a cathode contact point on the OLED unit.

According to aspects of the disclosed subject matter, a cover for an OLED unit is described, including a planar member having an inner surface and an outer surface; and two or more electrode contacts; wherein at least one electrode contact is suitable for connecting to an anode on an OLED unit and is electrically accessible from the outer surface, and at least one electrode contact is suitable for connecting to a cathode on an OLED unit and is electrically accessible from the outer surface. In one embodiment, the cover is suitable for connecting to a plurality of OLED units. In one embodiment, each OLED unit has a cathode and an anode, and the cover has at least one electrode contact for each OLED unit cathode and at least one electrode contact for each OLED unit anode. In one embodiment, the cover includes a circuit for connecting at least two electrode contacts together. In one embodiment, the cover is suitable for being disposed over only a portion of an OLED unit. In one embodiment, the cover is suitable for being disposed over only the perimeter of an OLED unit. In one embodiment, the cover further includes a circuit for connecting the plurality of OLED units in series. In one embodiment, the cover further includes a circuit for connecting the plurality of OLED units in parallel.

DETAILED DESCRIPTION

Described herein are OLED lighting systems and devices, and methods related to fabricating such OLED lighting systems and devices. The methods can be used to produce OLED systems and devices of varying sizes without changing the underlying OLED unit design. In one embodiment, the OLED lighting system includes a cover that connects a plurality of OLED lighting units. The cover includes contacts that are accessible from outside the system, such that each OLED lighting unit connected to the cover can be controlled in series or in parallel.

Figure 1:
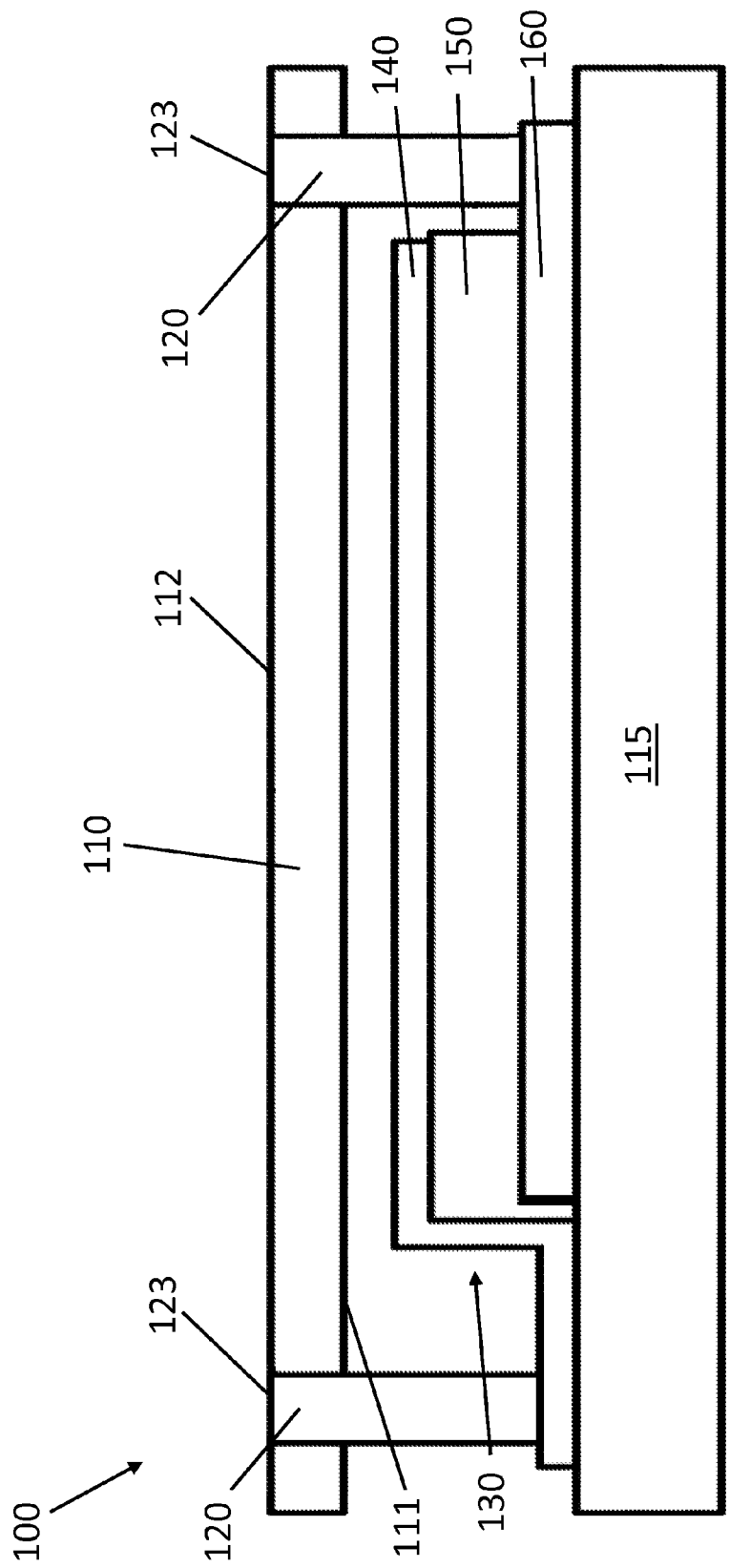
FIG. 1 is diagram of an exemplary OLED lighting device having a cover capable of making contacts to the OLED.

Referring now to FIG. 1, an embodiment of an OLED lighting device 100 is shown. Device 100 includes an OLED unit 130 disposed on a substrate 115. In one embodiment, substrate 115 is made of glass, however, in other embodiments, substrate 115 can be made of any other suitable material, including flexible materials. OLED unit 130 includes two electrodes 140 and 160, one for a cathode and one for an anode, with an organic emissive stack 150 between electrodes 140 and 160. Organic emissive stack 150 includes one or more organic light emitting layers. In one embodiment, organic emissive stack 150 can include layers other than light emitting layers, as would be understood by a person skilled in the art. Examples of OLED units, OLED materials, organic emissive stacks and layers included therein, and example materials, are described in U.S. Pat. Nos. 5,844,363, 6,303,238, 5,707,745, and 7,279,704, which are hereby incorporated by reference in their entirety.

Device 100 includes a cover 110 having an inner surface 111 and an outer surface 112, wherein the inner surface 111 faces OLED unit 130. Cover 110 is connected to OLED unit 130 via electrode contacts 120. In one embodiment, cover 110 is disposed over the entirety of substrate 115, such that cover 110 completely covers any and all components disposed on substrate 115, such as OLED unit 130. In another embodiment, cover 110 is disposed over only a portion of substrate 115. In one such embodiment, cover 110 can cover only the portion of device 100 that includes the connection between electrode contacts 120 and electrodes 140 and 160. Accordingly, it is contemplated herein that cover 110 can be a solid unit, or it can have openings or windows, as would be understood by a person skilled in the art. Further, cover 110 can have varying thickness at different locations of cover 110, or cover 110 can have substantially the same thickness throughout.

In one embodiment, more than one OLED unit 130 can be disposed on substrate 115 of device 100. In one such embodiment, cover 110 can be a solid cover that is disposed over all OLED units 130. In another such embodiment, cover 110 can have a "picture-frame" configuration, wherein cover 110 covers only a portion of each OLED unit 130, for example only the borders, or a portion of the borders, between each OLED unit 130. In yet another such embodiment, cover 110 can be disposed over some OLED units 130 while leaving other OLED units 130 uncovered, i.e., cover 110 can have either a uniform or non-uniform pattern. However, cover 110 is not limited to the embodiments specifically described herein and can have any configuration as would be understood by a person skilled in the art.

Electrode contacts 120 may be incorporated into cover 110 such that at least a portion 123 of each electrode contact 120 is accessible via the outer surface of cover 110. Further, each electrode contact 120 is connected to only one of electrodes 140 and 160, respectively. In one embodiment, device 100 can include more than two electrode contacts. In such an embodiment, at least one electrode contact connected to the OLED unit anode and at least one electrode contact connected to the OLED unit cathode are electrically accessible from the outer surface of cover 110. In one embodiment, cover 110 has a barrier property that can protect OLED unit 130. For example, cover 110 can provide a barrier to moisture and oxygen, or any other desired barrier property.

Figure 2:
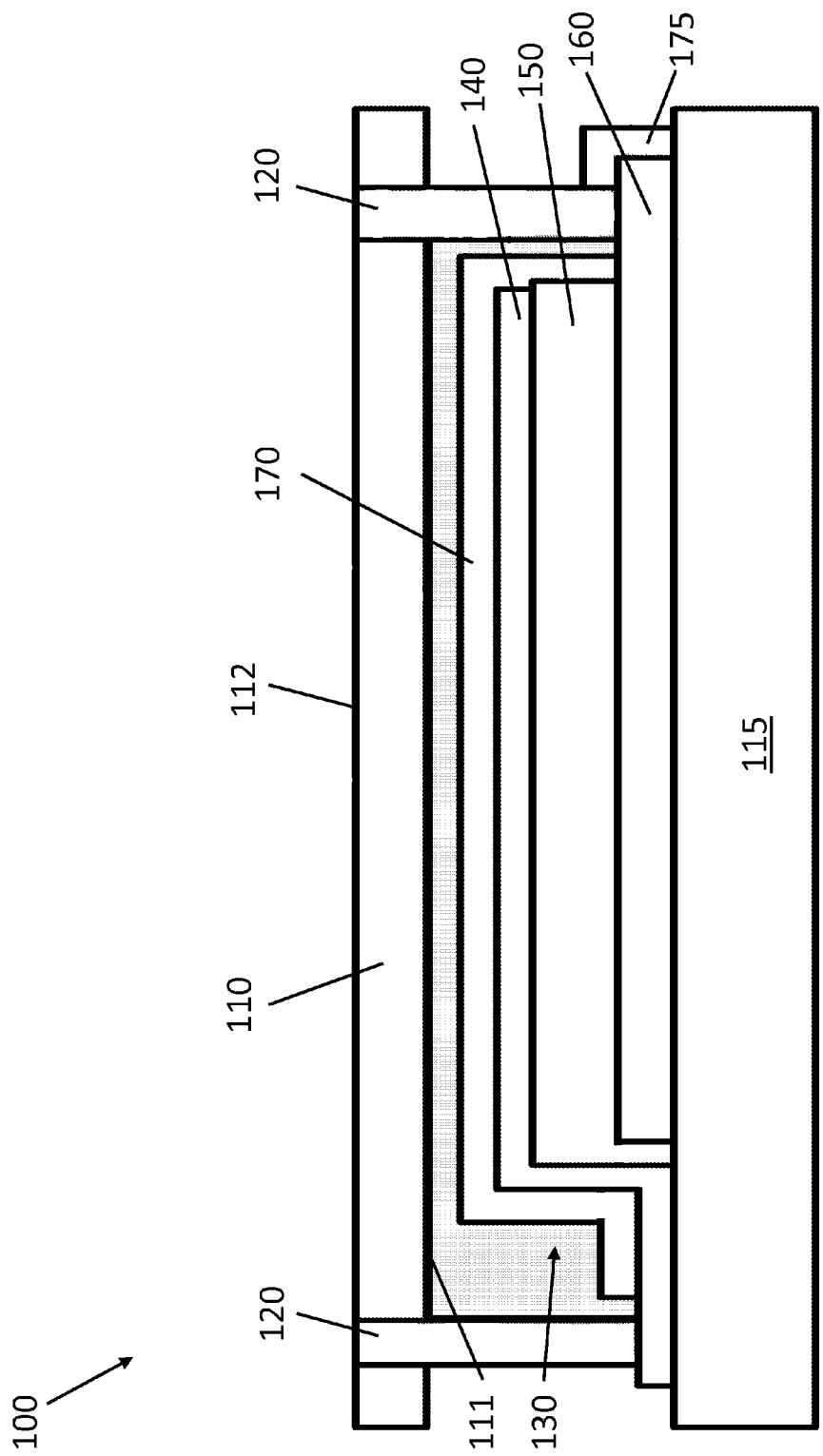
FIG. 2 is a diagram of an exemplary OLED lighting device including an insulating bank and thin film encapsulation.

Referring now to FIG. 2, another embodiment of OLED lighting device 100 is shown. A thin film encapsulation layer 170, which can also be referred to as a passivation layer, is applied over at least a portion of OLED unit 130 to provide barrier and/or mechanical protection. In one embodiment, cover 110 can be glued together with OLED unit 130. An insulating bank 175 can also be applied over at least a portion of electrode contacts 120 and electrode 140 and/or electrode 160. Insulating bank 175 is shown applied over electrode 160 and one electrode contact 120 in FIG. 2, but insulating bank 175 can also be applied over a portion of all electrodes and electrode contacts in device 100. Accordingly, insulating bank 175 can prevent shorting caused by any sharp edges associated with electrode contacts 120 and/or electrodes 140 and 160.

Figure 3:
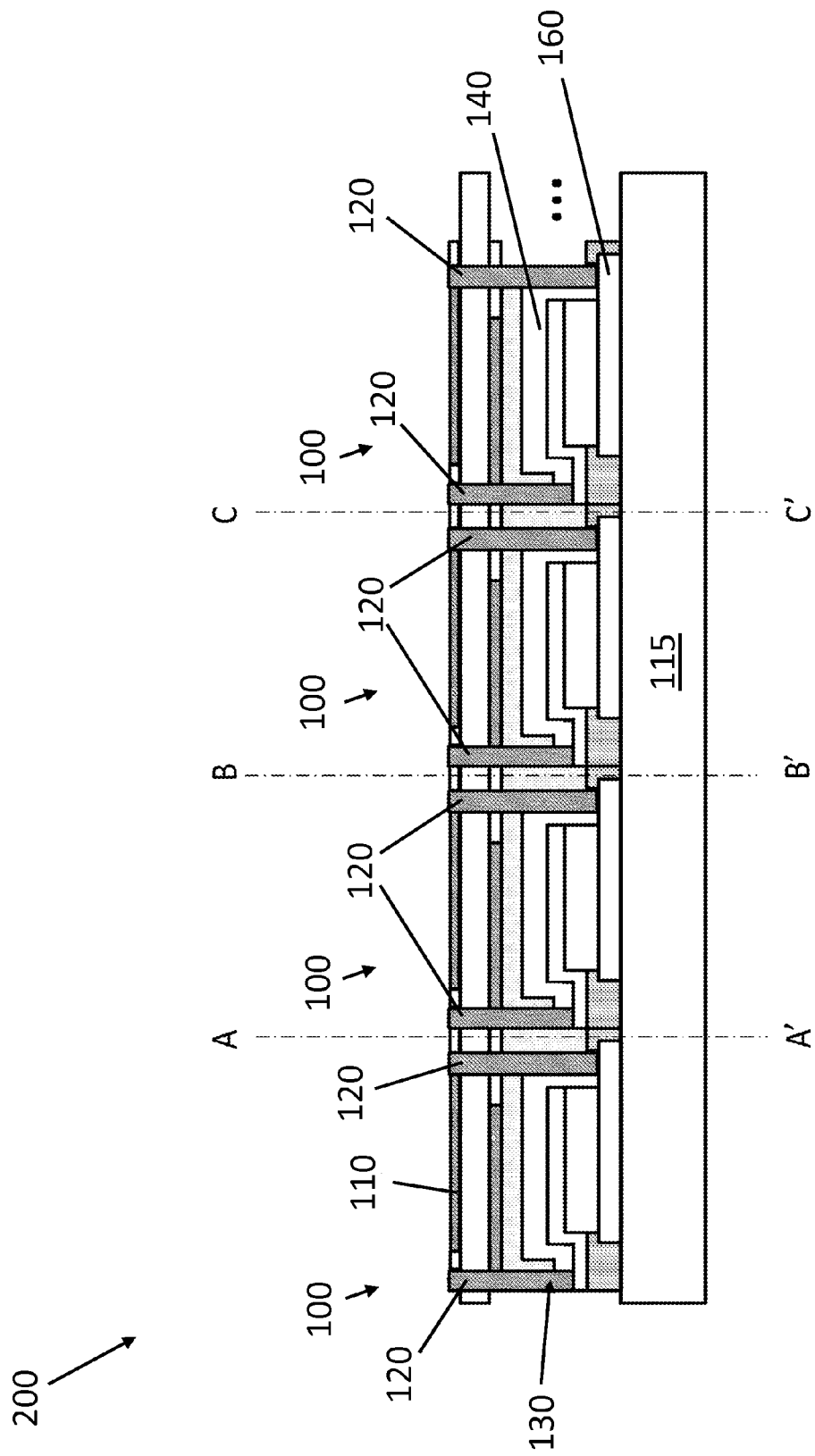
FIG. 3 is a diagram of an exemplary OLED lighting system panel.

Referring now to FIG. 3, an embodiment of an OLED lighting panel 200 is shown, having a plurality of OLED lighting devices 100. Each OLED lighting device 100 has an OLED unit 130 as described above. In this embodiment, the plurality of OLED lighting devices 100 share a single cover 110. Cover 110 has a plurality of contacts 120, wherein at least one contact 120 is connected to electrode 140 and at least one contact 120 is connected to electrode 160 in each OLED device 100. In one embodiment, contacts 120 in each OLED device 100 are electrically isolated from the contacts in every other OLED device 100 of panel 200. In another embodiment, each contact 120 connected to an anode can be connected to, or otherwise in electrical communication with, one or more contacts connected to an anode in another OLED device 100 of panel 200. Similarly, in such an embodiment, each contact 120 connected to a cathode can be connected to, or otherwise in electrical communication with, one or more contacts connected to a cathode in another OLED device 100 of panel 200. Further, in such an embodiment, at least one of the contacts 120 connected to an anode and at least one of the contacts 120 connected to a cathode are electrically accessible via the outer surface of cover 110. In another embodiment, each and every contact 120 can be separately electrically accessible via the outer surface of cover 110. In one embodiment, at least a portion of contacts 120 can be connected together via circuit lines integrated with, associated with, or otherwise in contact with cover 110. In another embodiment, contacts 120 can be connected separately to external electronics via circuit lines. As would be understood by a person skilled in the art, device(s) 100 can include any additional circuitry or electronics not specifically described herein that would be useful or necessary for the desired end-use application.

The plurality of OLED devices 100 of panel 200 can be connected together in series, in parallel, or some mixture of both series and parallel connections. In one embodiment, cover 110 can include some or all of the required connections embedded therein. For example, cover 110 can include a circuit, or a plurality of circuits, suitable for connecting some or all of the various contacts 120. In another embodiment, the interconnection of the plurality of OLED devices 100 can be arranged through soldering or attaching a circuit board layer with the desired connections, wherein such connections are external to cover 110. Accordingly, in one embodiment, when one cathode and one anode of panel 200 are connected to a power source, all of the OLED devices 100 can light up. In other embodiments, the interconnection of the plurality of OLED devices 100 can be arranged such that only a selected number of the OLED units light up. In one embodiment, as described above, each device 100 can have more than one contact for each type of electrode. For example, each device 100 can have multiple anode contacts and multiple cathode contacts.

Panel 200 can be divided into lighting systems with a desired number of OLED units 100. For example, referring again to FIG. 3, if panel 200 is divided only along line A-A', one portion will have a single OLED unit 100 while the other portion will have three OLED units 100. If panel 200 is divided only along line B-B', two portions each having two OLED units 100 will result. Cover 110 can be connected before or after dividing panel 200 into separate lighting units. It is contemplated herein that each device 100 can be physically and/or electrically integrated with one or more additional devices 100, and panel 200 is not limited to having only four devices 100 as shown in FIG. 3. Further, any devices 100 of panel 200 are not required to be electrically connected with each other and one or more devices 100 of panel 200 can be electrically isolated from a portion of, or all of, the other devices 100 of panel 200. Further, devices 100 are not limited to OLED lighting devices of any specific color or type, and devices 100 can also include OLED display devices.

Figure 4:
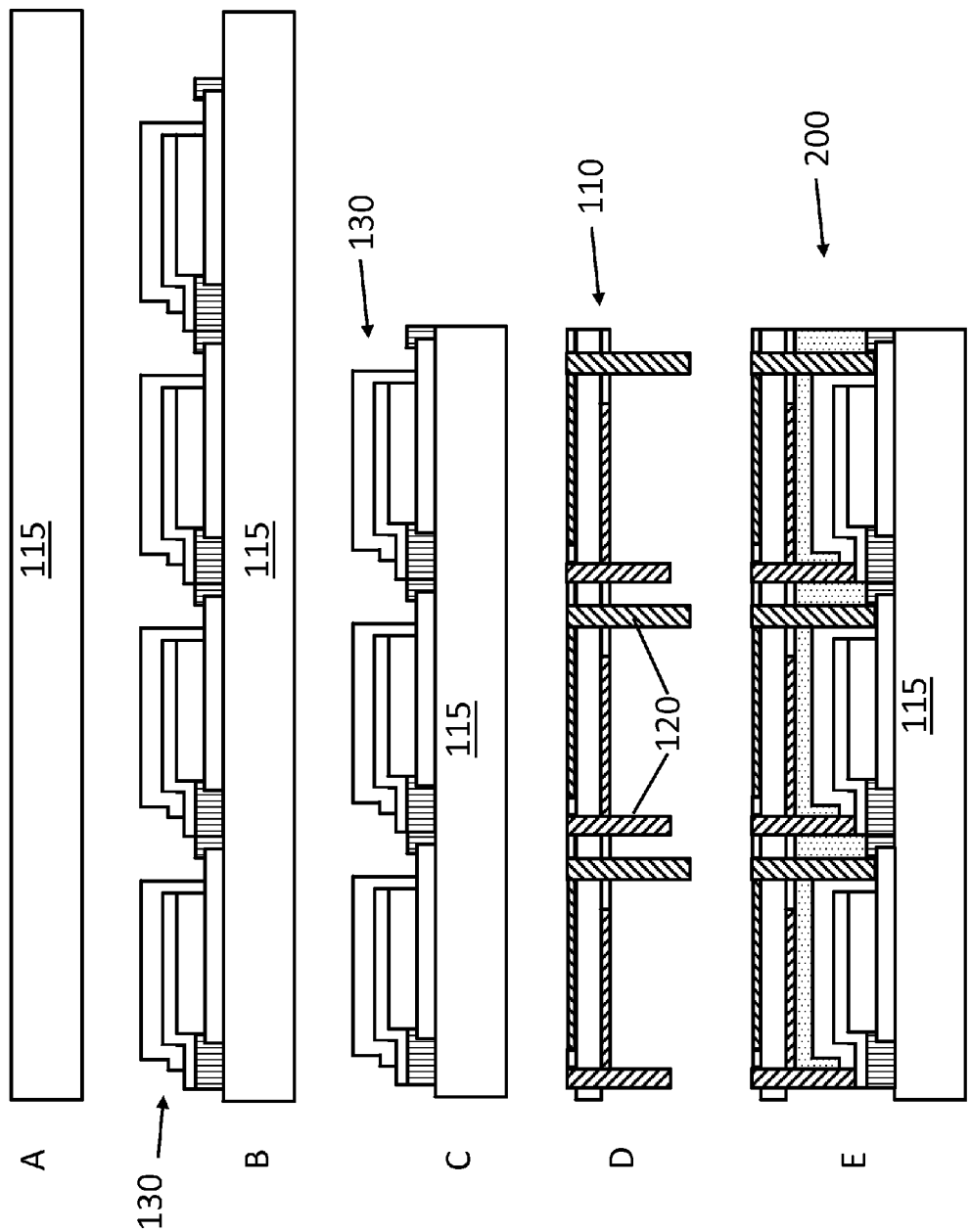
FIG. 4 is a set of diagrams showing an embodiment of an exemplary fabrication method of an OLED lighting system panel.

Referring now to FIG. 4, in one embodiment, an exemplary method for fabricating an OLED lighting device can include the following steps: providing a substrate 115 (FIG. 4A); disposing one or more OLED units 130 on the substrate (FIG. 4B), as described previously herein, OLED units 130 should include an anode, at least one organic light emitting layer, a cathode; optionally dividing the one or more OLED units 130, which can be done by cutting, scribing, or any other suitable technique, either before or after applying a cover (FIG. 4C); providing a cover 110 for the one or more OLED units 130, wherein cover 110 includes a plurality of contacts 120 (FIG. 4D); and connecting contacts 120 with the OLED units 130, such that OLED units 130 can be electrically connected to an external power source and/or controller (FIG. 4E). In one embodiment, cover 110 can include contacts 120 that may protrude, be flush, or slightly recessed, or are otherwise electrically accessible from the outer surface of cover 110, such that OLED units 130 can be connected to a power source and/or controller.

Figure 5:
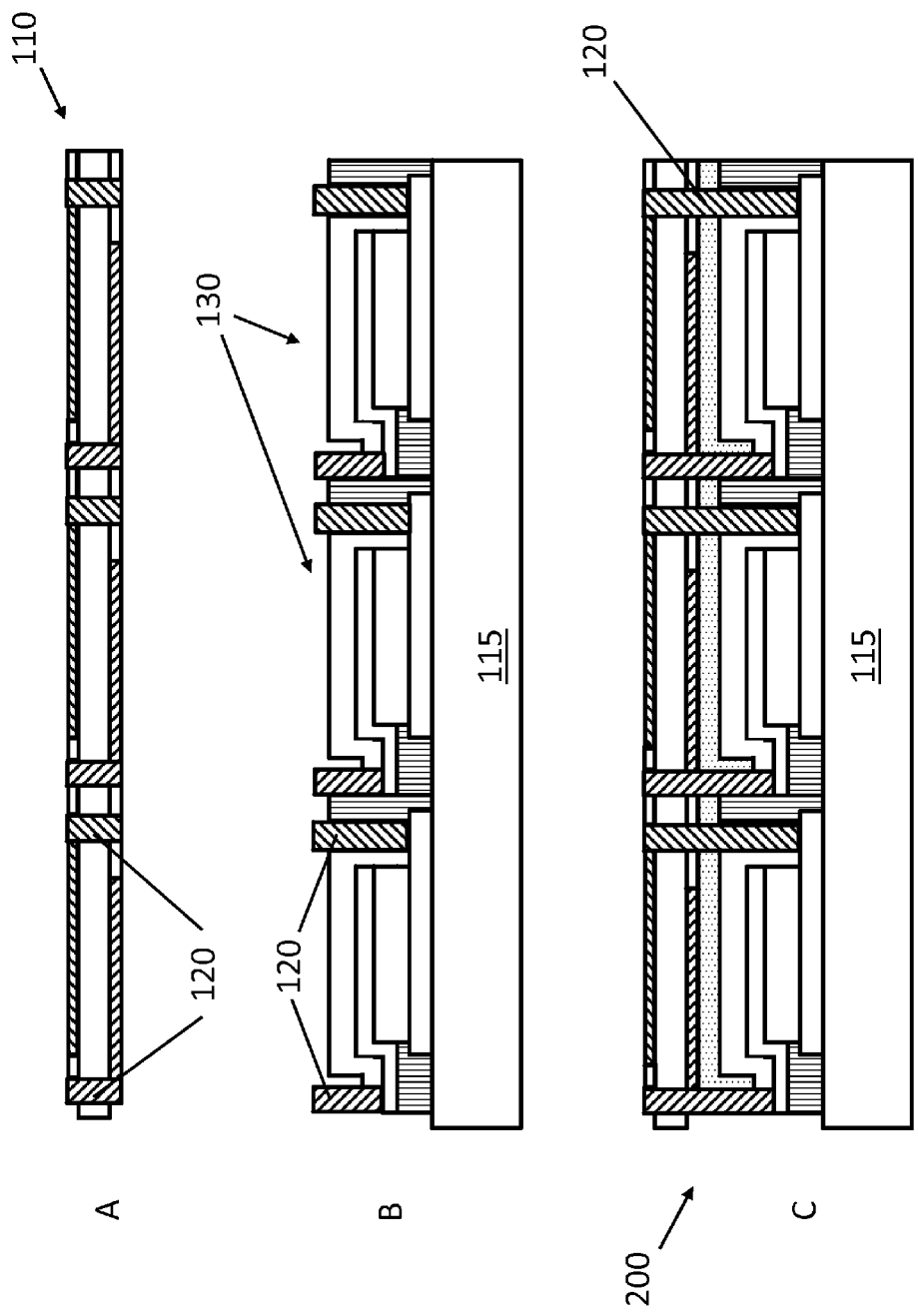
FIG. 5 is a set of diagrams showing an embodiment of another exemplary fabrication method of OLED lighting system panel.

In another embodiment, as shown in FIG. 5, cover 110 can include a portion of contacts 120 (FIG. 5A), while OLED devices 130 can also include a portion of contacts 120 (FIG. 5B). In such an embodiment, when cover 110 is connected to OLED devices 130, contacts 120 are aligned and connected such that a portion of contacts 120 are electrically accessible from the outer surface of cover 110 on OLED panel 200 (FIG. 5C). In one such embodiment, the contacts on OLED devices 130 can be deposited using a z-direction conductive glue, or any other suitable method, as would be understood by a person skilled in the art.

The use of a single cover for multiple OLED units, as described herein, provides a significant improvement over lighting panel devices and lighting panel fabrication methods currently available. In one embodiment, a single OLED panel can be used to create multiple lighting systems, even systems having different sizes. For example, consider an OLED panel on a glass substrate with the dimensions of 1500 mm×1850 mm. If the dimension of each OLED device is about 4×4 inches (101.6 mm×101.6 mm), then 15×18 OLED units, or about 270 OLED units can be made at the same time on a single piece of substrate. Depending on how the OLED panel is cut, the panel can be used to make any combination of shapes or sizes, as would be understood by a person skilled in the art, such as thirty 1 ft.×1 ft. luminaires or six 2 ft.×2 ft. luminaires. Further, when making, for example, a 2 ft.×4 ft. luminaire, a 2 ft.×4 ft. piece can be directly cut from the substrate, instead of the current method, which would require cutting 72 pieces of individual 4 in.×4 in. panels and reassembling them into a 2 ft.×4 ft. piece.

Once cover 110 is connected to the OLED units, all of the underlying OLED units can be electrically addressed through the contact points on the cover, regardless of the shape or size of the desired lighting system. Further, using the cover design described herein, there is no need to change the OLED fabrication process and/or tooling, and the cover eliminates the need for separately packaging or connecting individual OLED units, for example connecting multiple 4 inch x 4 inch OLED units to produce a lighting system having the desired dimensions. Accordingly, the manufacturing cost of such systems can be significantly reduced. In one embodiment, the lighting panel configuration described herein can be used for a roll-to-roll process for making flexible OLED lighting systems. Another benefit of the systems and methods described herein is that the dead space between OLED units can be minimized or eliminated, unlike currently available designs needing individually packaged OLED devices that are then connected together.

In one embodiment, the individual OLED units 130 can be further divided into a plurality of pixels or subpixels. Further, in one embodiment, each pixel can have a fuse, for example as described in U.S. Pat. App. Pub. No. 20120181933, which is herein incorporated by reference in its entirety. When using a fuse, any damage caused by a local defect can be limited to a single pixel, and the rest of the OLED units or pixels can remain unaffected. In addition, the pixels within the each OLED unit also can be individually hermetically sealed, as would be understood by a person skilled in the art. With the use of fuses and hermetically sealed pixels, the OLED lighting system described herein can support cutting or otherwise dividing through the active area. When the OLED device is divided, the fuse can protect undivided regions from shorting, the individually hermetically sealed pixels can prevent moisture and/or oxygen from damaging the device through the divided region, and the cover can provide contact points that have access to any location on the device so that the entire device, or any portion thereof, can light up when powered.

In one embodiment, cover 110 can include more than two types of contacts 120, i.e., more than just single anode and single cathode contacts. For example, for a color-tunable OLED device with three color components, four contact points are typically needed to conduct the color tuning. Accordingly, cover 110 can include four isolated contacts, corresponding to the four contacts for each basic OLED unit. In other embodiments, cover 110 can include any number of contacts, as would be understood by a person skilled in the art.

The OLED units can be of any shape, for example, but not limited to: squares, hexagons, triangles, or any combination thereof, as would be understood by a person skilled in the art. The shapes and sizes of each OLED unit can be chosen for aesthetic considerations, or they can be chosen to provide the most active area for a given substrate, i.e., to optimize or even eliminate the amount of dead space between units. In addition, the systems and devices described herein can be used for both rigid and flexible OLEDs, i.e., the cover can be made of rigid, semi-rigid, or flexible material, and the contacts can be suitably arranged or designed to accommodate a flexible device.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. An OLED device, comprising:
a substrate;
an OLED unit disposed on said substrate, said unit comprising an anode, a cathode, and at least one organic light emitting layer between the anode and cathode;
two or more electrode contacts; and
a cover having an inner surface and an outer surface, wherein the inner surface faces the OLED unit; and
wherein at least one electrode contact is connected to the OLED unit anode and at least one electrode contact is connected to the OLED unit cathode, and each electrode contact is further connected to the cover, such that at least one electrode contact connected to the OLED unit anode and at least one electrode contact connected to the OLED unit cathode are electrically accessible from the outer surface of the cover.

2. The device of claim 1, wherein the OLED unit is hermetically sealed.

3. The device of claim 1, wherein the cover further comprises a circuit for coupling at least two electrode contacts together.

4. The device of claim 1, wherein at least one electrode contact comprises a z-direction conductive glue.

5. The device of claim 1, further comprising one or more additional OLED units, wherein the cover is disposed over at least a portion of each OLED unit.

6. The device of claim 5, wherein the cover further comprises a circuit for connecting two or more OLED units in series.

7. The device of claim 5, wherein the cover further comprises a circuit for connecting two or more OLED units in parallel.

8. The device of claim 5, wherein each OLED unit is electrically isolated before the cover is applied.

9. A method of fabricating an OLED device, comprising:
providing a substrate,
disposing an OLED unit on the substrate, said unit comprising an anode, a cathode, and at least one organic light emitting layer between the anode and cathode,
providing a cover having an inner surface, an outer surface, one or more anode cover contacts, and one or more cathode cover contacts, and
connecting together the cover and the OLED unit,
wherein the inner surface of the cover faces the OLED unit, and at least one of the one or more anode cover contacts and at least one of the one or more cathode cover contacts are electrically accessible from the outer surface of the cover.

10. The method of claim 9, further comprising disposing at least one additional OLED unit on the substrate prior to connecting the cover and the OLED units together.

11. The method of claim 10, further comprising the step of dividing the OLED units into panels of one or more OLED units.

12. The method of claim 11, wherein the step of dividing the OLED units into panels is performed prior to connecting the cover to the OLED units.

13. The method of claim 10, wherein each OLED unit is electrically isolated before the cover is applied.

14. The method of claim 9, wherein the OLED unit further comprises one or more anode contact points connected to the anode, and one or more cathode contact points connected to the cathode, and wherein when the cover is connected to the OLED unit, at least one of the one or more anode cover contacts is in contact with an anode contact point on the OLED unit and at least one of the one or more cathode cover contacts is in contact with a cathode contact point on the OLED unit.

15. A cover for an OLED unit, comprising,

A planar member having an inner surface and an outer surface; and two or more electrode contacts;

wherein at least one electrode contact is suitable for connecting to an anode on an OLED unit and is electrically accessible from the outer surface, and at least one electrode contact is suitable for connecting to a cathode on an OLED unit and is electrically accessible from the outer surface.

16. The cover of claim 15, wherein the cover is suitable for connecting to a plurality of OLED units.

17. The cover of claim 16, wherein each OLED unit has a cathode and an anode, and the cover has at least one electrode contact for each OLED unit cathode and at least one electrode contact for each OLED unit anode.

18. The cover of claim 15, wherein the cover is suitable for being disposed over only a portion of an OLED unit.

19. The cover of claim 16, further comprising a circuit for connecting the plurality of OLED units in series.

20. The cover of claim 16, further comprising a circuit for connecting the plurality of OLED units in parallel.

\* \* \* \* \*